United States Patent [19]

Ikeda

[11] 4,105,946
[45] Aug. 8, 1978

[54] FREQUENCY SYNTHESIZER WITH PHASE LOCKED LOOP AND COUNTER

[75] Inventor: Yuji Ikeda, Tokyo, Japan

[73] Assignee: Sansui Electric Co., Ltd., Tokyo, Japan

[21] Appl. No.: 813,313

[22] Filed: Jul. 6, 1977

[51] Int. Cl.² ............................................. H03B 3/04
[52] U.S. Cl. ..................... 331/1 A; 331/10; 331/14; 331/16; 331/19; 331/25
[58] Field of Search .................. 331/1 A, 10, 11, 14, 331/16, 19, 25, 34, 36 C

[56] References Cited

U.S. PATENT DOCUMENTS

| | | | |
|---|---|---|---|
| 3,427,561 | 2/1969 | Hamer | 331/19 |
| 3,676,794 | 7/1972 | Bidell et al. | 331/11 |
| 3,694,766 | 9/1972 | Boelke | 331/11 |

*Primary Examiner*—Siegfried H. Grimm
*Attorney, Agent, or Firm*—Harris, Kern, Wallen & Tinsley

[57] ABSTRACT

A frequency synthesizer including a phase-locked loop (PLL) is provided which does not use any variable frequency divider. The output of a reference frequency oscillator is applied to a phase comparator in the PLL through a monostable multivibrator. The oscillating frequency of a voltage controlled oscillator (VCO) in the PLL can be selected by controlling a bias DC voltage applied to a control element in the VCO. The output waves from said VCO are counted at a counter during a period of the reference frequency from the reference frequency oscillator of the PLL. The count operation is repeated at a predetermined time interval. After completion of each count operation, the number in the counter corresponding to the least digit column of the decimal number is discriminated to determine whether it is within a predetermined range or not. The range is determined correspondingly to a locking range of the PLL. When it is within the range, the PLL is placed into an operating condition to stabilize the oscillating frequency of the VCO at a desired frequency. Also, the counted number is indicated by an indicator. The number in the counter corresponding to the least digit column of the decimal number may be converted into an analogue signal to automatically control the oscillating frequency of the VCO.

20 Claims, 7 Drawing Figures

1

FREQUENCY SYNTHESIZER WITH PHASE LOCKED LOOP AND COUNTER

BACKGROUND OF THE INVENTION

This invention relates to frequency synthesizer devices and, in particular, to such devices using a phase-locked loop (PLL) comprising a voltage control oscillator (VCO), a phase comparator and a reference frequency oscillator.

A typical known frequency synthesizer using the PLL, as shown in FIG. 1, comprises a VCO 11, a variable frequency divider 12 which frequency divides the output frequency of the VCO 11, a reference frequency oscillator 13, and a phase comparator 14 which phase-compares between the output from the divider 12 and the reference frequency from the reference frequency oscillator 13 to apply the detected phase-difference signal to the VCO 11 as a control signal.

Generally, a DC amplifier 15 is provided between the output of the phase comparator 14 and the VCO 11 in order to amplify the phase-difference signal.

The variable frequency divider 12 is given a desired number information (N is a positive integer) by a suitable means and provides a signal having a frequency of 1/N of the input frequency value.

Accordingly, the output frequency $f_0$ of the VCO 11 is maintained at a frequency of N times of the reference frequency $f_r$. Therefore, a desired frequency can be selected by selecting the number of N to be given to the variable frequency divider.

Since the reference frequency oscillator is, usually, a crystal oscillator with a high frequency stability, the oscillating frequency of the VCO is stabilized.

The known frequency synthesizer has been used, for example, as a local oscillator in a FM receiver, because of the high frequency stability.

But the known frequency synthesizer has a disadvantage that the variable frequency divider is very expensive because it is required to have a high dividing precision.

Another disadvantage is that the frequency selection is hardly possible by a continuous operation such as rotating operation of a selection dial.

SUMMARY OF THE INVENTION

An object of this invention is to provide a frequency synthesizer device using a PLL but using no variable frequency divider.

Another object of this invention is to provide a frequency synthesizer device using a PLL wherein the oscillating frequency of the VCO in the PLL is selected by a continuous operation of a selection dial.

A further object of this invention is to realize the above objects with a simple, economical, compact and useful construction.

According to this invention, a frequency synthesizer comprises a PLL including a VCO, a reference frequency oscillator, means for providing a series of harmonic waves of a reference frequency signal from a reference frequency oscillator and a phase comparator for detecting a phase-difference between the output from said VCO and the harmonic waves to apply the phase-difference signal to the VCO as a control signal. The VCO is provided with means for coarsely changing the output frequency of the VCO to a desired frequency. The synthesizer further comprises first gate means coupled with the output of the VCO, counter means for counting the number of output waves from the VCO through the first gate means, first latching means coupled with an output of the counter means corresponding to the least digit column of the decimal number, second gate means connected in a closed loop of the VCO and the phase comparator, means for providing a gate signal to open the second gate means at a time when the number from the first latching means is in a predetermined range, second latching means coupled with the counter means, first indicator means for indicating the desired frequency value correspondingly to the counted number through the second latching means, and means coupled with the output from the reference frequency oscillator for providing a gate pulse to open the first gate means, latching signals to operate the first and second latching means and a reset signal to reset the counter means.

The gate pulse has a pulse width predetermined and corresponding to the reference frequency and is repeatedly generated with a constant period. The latching signals are provided just after each gate pulse turns off and the reset signal is generated after the latching signal.

A digital-analogue (D/A) converter means for converting the number from the first latching means into a corresponding analogue signal and means for applying the analogue signal to the VCO as a voltage control signal may be additionally provided.

The coarse frequency changing means may be a variable condenser which is connected in parallel with a control element or a variable capacity diode in the VCO, or a variable voltage DC source which is applied together with the control signal to the VCO.

The PLL may be of a type wherein the output of the VCO is mixed with the harmonic waves at a mixer, the mixed output being phase-compared with an IF frequency signal. The IF frequency signal must be selected at a frequency of integer times of the reference frequency value.

Further objects and features of this invention will be understood from following descriptions in conjunction with preferred embodiments referring to annexed drawings.

DETAILED DESCRIPTION OF PREFERRED EMBODIMENTS

Figure 2:
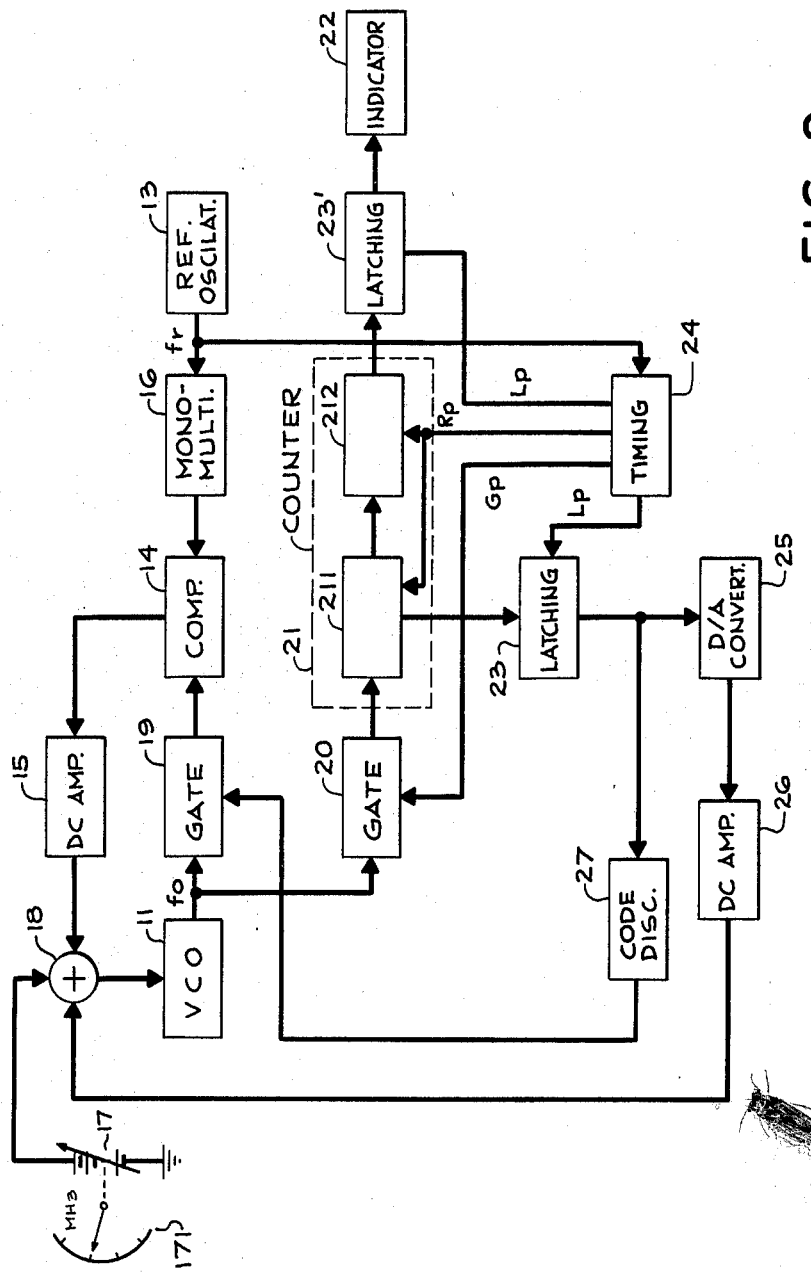
FIG. 2 shows a block diagram of an embodiment according to this invention.

Referring to FIG. 2, which shows an embodiment of this invention, the embodiment comprises a modified PLL comprising a VCO 11, a reference frequency oscillator 13, a monostable multivibrator 16 coupled with the output of the reference frequency oscillator 13 for providing a series of harmonic waves, a phase comparator 14 for comparing the oscillating frequency of the VCO with the harmonic waves to apply a detected phase-difference signal to the VCO 11 as a control signal through a DC amplifier 15.

Figure 1:
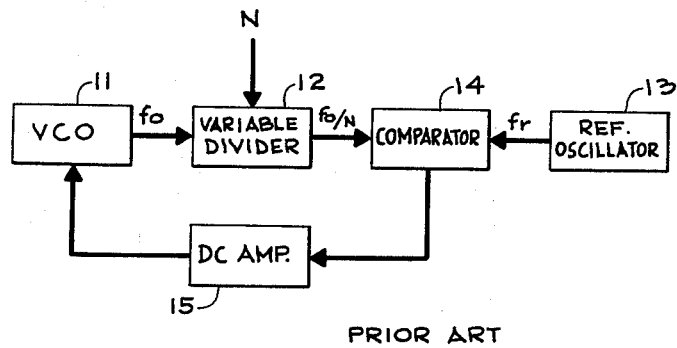
FIG. 1 shows a block diagram of a typical known frequency synthesizer device.
Figure 3:
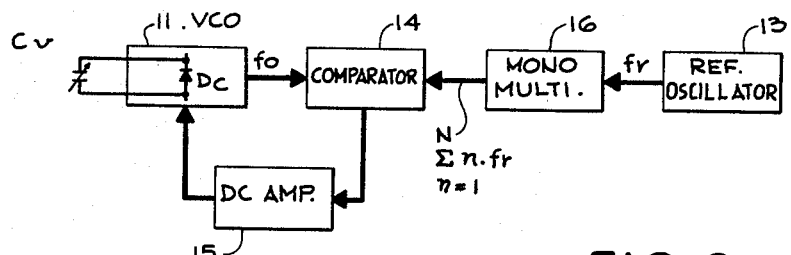
FIG. 3 shows a block diagram of a modified PLL in the embodiment in FIG. 2.

Only a portion of the modified PLL is shown in FIG. 3, with same reference numerals being used.

Referring to FIG. 3, when the reference frequency of the oscillator 13 is $f_r$, the harmonic waves of the multivibrator 16 is represented as $$\sum_{n=1}^{N} n \cdot f_r$$

Therefore, the oscillating frequency $f_0$ of the VCO is stabilized at a frequency of $n \cdot f_r$. Therefore, if the oscillating frequency of the VCO 11 is continuously changed, it is stabilized at each frequency of $f_0 = n \cdot f_r$ ($n = 1, 2 \ldots N$).

As a means for continuously changing the oscillating frequency of the VCO, a variable condenser $C_v$ is used. The variable condenser is provided in parallel with a frequency control element, or a variable capacity diode $D_c$ in the VCO.

As another means for continuously changing frequency of the VCO, a variable DC voltage source may be used, the voltage of which is applied to the frequency control element in the VCO by adding to the control signal from the phase comparator.

In the embodiment in FIG. 2, the variable DC voltage source is shown by 17, and an adder is shown by 18.

Back to FIG. 2, a gate 19 is provided between the output of the VCO 11 and an input of the phase comparator 14 to control operation of the PLL. The gate 19 may be provided between the phase comparator 14 and the DC amplifier 15, or between the DC amplifier 15 and the adder 19.

Another gate 20 is coupled with the output of the VCO 11 to apply the output waves to a counter 21, which counts input waves during a period when the gate 20 is open.

The counter 21 comprises two counter portions 211 and 212. The first counter 211 counts by decimal numbers of one digit and the second counter 212 counts the carry signals from the first counter 211. Therefore the first counter 211 is for the least significant digit of decimal numbers of the count by the counter 21 and the second counter 212 is for the more significant digits. The first counter 211 will be referred as "lowest digit counter" and the second counter 212 will be referred as "higher digits counter".

The outputs of both counters 211 and 212 are connected to latching circuits 23 and 23'.

A timing circuit 24 is provided for generating a gate pulse to open the gate 20, a latching signal to operate the latching circuits 23 and 23' and a reset signal to reset the counter 21.

The timing circuit 24 is coupled with the output of the reference frequency oscillator 13 and provides the gate pulse having a pulse width determined according to the frequency of the reference frequency wave. The gate pulse is repeatedly generated with a constant interval.

The latching signal is generated just after each gate pulse ends, or turns off, and the reset signal is developed ater the latching signal but before the next gate pulse.

Accordingly, the output waves of the VCO 11 are counted at the counter 21 during a determined time period repeatedly at intervals of a constant period, and the counted number is maintained at latching circuits 23 and 23' after each counting operation of the counter 21.

Figure 4:
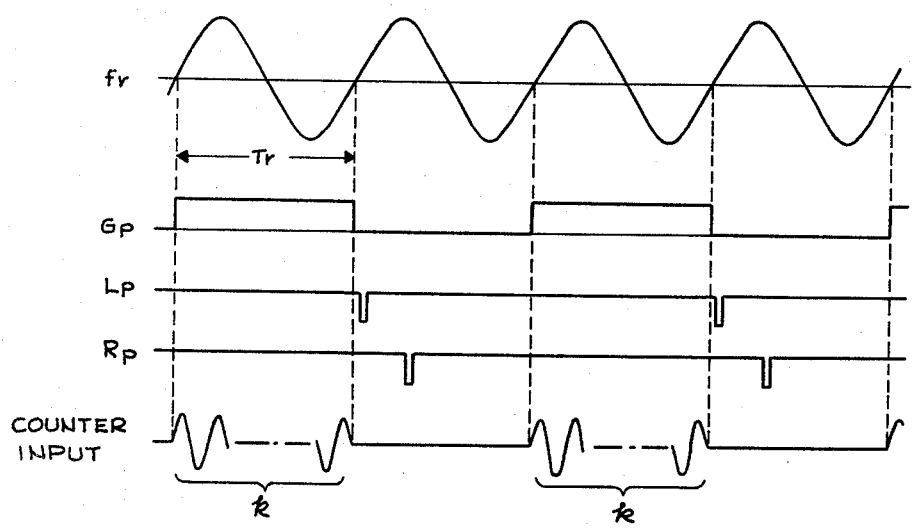
FIG. 4 shows waveforms in various points in FIG. 2.

Referring to FIG. 4, the gate pulse $G_p$ has a pulse width equal to the period $T_r$ of the reference frequency wave $f_r$ as shown. In this case, the number $k$ counted at the counter 21 during the period $T_r$ represents the value of $f_0/f_r$.

The number $k$ is maintained at latching circuits 23 and 23' by the latching signal $L_p$ which is generated just after the gate pulse $G_p$ ends, and, thereafter, the reset pulse $R_p$ resets the counter 21.

When the next gate pulse is generated, a similar counting operation is begun and the similar operation is repeated.

Figure 5:
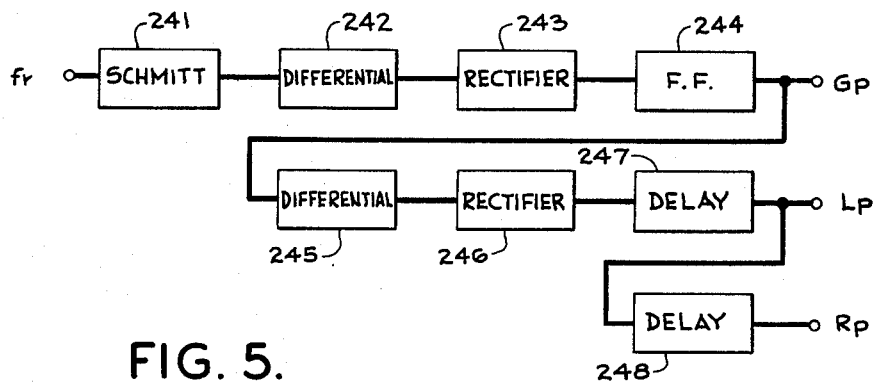
FIG. 5 shows a block diagram of an example of the timing circuit in FIG. 2.

An example of the timing circuit 24 which provides gate pulse $G_p$, latching signal $L_p$ and reset signal $R_p$ with a time relation as shown in FIG. 4, is shown in FIG. 5.

Referring to FIG. 5, a Schmitt trigger circuit 241 provides a square wave signal from a sine wave signal of the reference frequency wave $f_r$ from the oscillator 13. The output from the Schmitt trigger circuit 241 is applied to a differential circuit 242 and, thereafter, is rectified at a rectifier 243. The rectified signal is applied to a flip-flop circuit 244, from which the gate pulse $G_p$ as shown in FIG. 4 is provided.

The output from the flip-flop circuit 244 is, also, applied to a differential circuit 245 and, thereafter, is rectified at a rectifier 246. The rectified signal is applied to a delay circuit 247, from which the latching signal $L_p$ as shown in FIG. 4 is provided.

The output from the delay circuit 247 is, also, applied to another delay circuit 248, from which the reset signal $R_p$ is provided as shown in FIG. 4.

Referring to FIG. 2, an indicator 22 is connected to the latching circuit 23' to indicate the number counted in the higher digits counter 212. Therefore, if the gate pulse has a pulse width equal to the period $T_r$ of the reference frequency wave $f_r$, the indication of the indicator 22 represents the value $k = f_0/f_r$ approximately, although the number of the lowest digit of $k$ is not indicated.

If the indicator 22 is desired to indicate frequency value, a multiplier may be provided before the latching circuit 23', which gives $m \cdot f_r$ ($m$ is the number counted at the higher digits counter 212).

If the reference frequency $f_r$ is $10^n$ Hz, it will be noted that the number counted at the higher digits counter directly gives an approximate value, or a value of higher digits, of the oscillating frequency $f_0$ of the VCO. Therefore no multiplier must be used.

Furthermore, if the gate pulse width is determined to be a value which is not equal to the period $T_r$ of the reference frequency wave $f_r$, it will be understood that a provision of multiplier means before the latching circuit 23' enables the frequency indication by the indicator 22.

The indicator 22 is not required to indicate all digits of the number counted by the higher digits counter 212.

The variable voltage DC source 17 is provided with a dial scale 171 to coarsely indicate, or to indicate numbers of higher orders of, selected frequencies. In that case, the indicator 22 indicates values of such lower orders which cannot be sufficiently indicated. Therefore, the higher digits counter 212 does not have a sufficient capacity for providing the number of the all input pulses during the counting period.

The output of the latching circuit 23 is connected to a code discriminator 27 which discriminates whether the number from the latching circuit 23 is within a predetermined range, for example, the numbers 9, 0 and 1. The range is determined correspondingly to a locking range of the PLL.

When the number is 9, 0 or 1, the discriminator 27 provides a signal to open the gate 19.

Thus, the PLL is placed in an operating condition, the oscillating frequency of the VCO is stabilized at the instant frequency, which is indicated by indicators 17 and 22.

If the number from the latching circuit 23 is not any one of 9, 0 and 1, the PLL is not placed in operating condition. The operation of the variable voltage DC source will bring into the operating condition of the PLL.

Preferably, a digital-analogue (D/A) converter 25 may be provided at the output of the latching circuit 23 to provide an analogue signal corresponding to the number from the latching circuit 23. The analogue signal is applied to the VCO 11 to automatically control the oscillating frequency thereof so as to bring the number from the latching circuit 23 into zero (0). Thus, the oscillating frequency is varied steply by the continuous operation of the variable voltage DC source 17.

Figure 6:
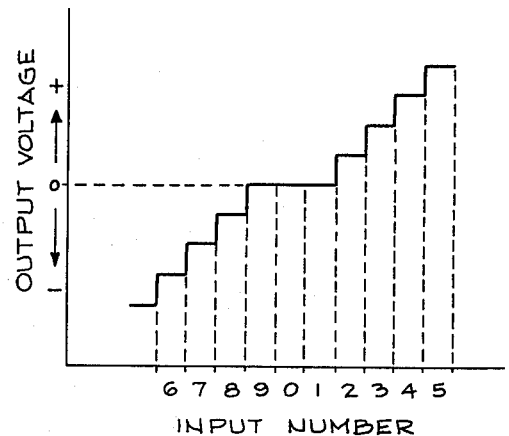
FIG. 6 shows a characteristic of a digital to analogue converter suitable for use in the system of FIG. 2.

An example of a characteristic of the D/A converter 25 is shown in FIG. 6.

When the number from the latching circuit 23 is within 9-1, or any one of 9, 0 and 1, the output of the converter 25 is zero volts. When it is within 6-8, the voltage of the output of the converter 25 is negative and its level is corresponding to the number. When the number is within 2-5, the voltage of the output has a positive level corresponding to the number.

The positive level and the negative level are determined by the characteristic of the VCO 11.

A DC amplifier 26 is for amplifying the output from the D/A converter.

Figure 7:
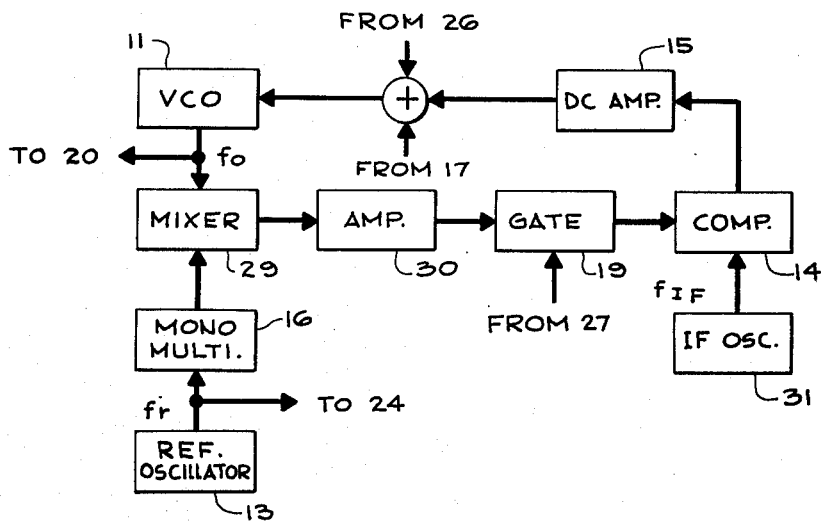
FIG. 7 shows a block diagram of another embodiment, but only a portion different from FIG. 2 being illustrated.

FIG. 7 shows another embodiment of this invention. This embodiment is similar as the embodiment shown in FIG. 2 except for the PLL arrangement. Accordingly, the portion of the PLL arrangement is only shown with the other circuit members being omitted for the simplification. Similar parts are represented by same reference numerals.

Referring to FIG. 7, the output of the VCO 11 is mixed with the harmonic waves at a mixer 29. The output from the mixer 29 is applied to the phase-comparator 14 through an amplifier 30.

The gate 19 is connected between the amplifier 30 and the phase comparator 14, to usually break the operation of the PLL.

The phase comparator 14 compares the output from the mixer 29 with an output from an IF frequency oscillator 31.

The frequency $f_{IF}$ of the IF frequency oscillator 31 is selected to be a value of $a$ times (a is an integer) of the reference frequency $f_r$ of the reference frequency oscillator 13. Therefore, the IF frequency wave may be provided through a frequency multiplier from the reference frequency oscillator 13.

The output of the phase comparator 14 is applied to the VCO 11 as a control signal through the DC amplifier 15 and the adder 18.

The output of the VCO 11 is coupled with gate (20, in FIG. 2). The output of the reference frequency oscillator 13 is coupled with timing circuit (24, in FIG. 2). An input terminal of the adder 18 is coupled with the variable voltage DC source (17, in FIG. 2) and the other terminal is coupled with the D/A converter (25, in FIG. 2) through DC amplifier (26, in FIG. 2).

In this PLL arrangement, the output frequency $f_0$ of the VCO 11 is stabilized at a frequency as given by following equation:

$$f_0 = nf_r - f_{IF} = (n - a)f_r$$

where, $n = 1, 2, 3 \ldots N$.

Accordingly, it will be easily understood that this embodiment operates similarly to the embodiment shown in FIG. 2. Therefore further description of this embodiment is omitted for simplification.

This invention has been described in conjunction with preferred embodiments. But this invention is not restricted to those specific embodiments, but various modification and designation are easily made by those skilled in the art within the scope of this invention.

What is claimed is:

1. In a frequency synthesizer device having a phase locked loop comprising voltage controlled oscillator means, reference frequency oscillator means and phase comparator means for comparing a phase difference between outputs from the voltage controlled oscillator means and the reference frequency oscillator means to apply the compared output to the voltage controlled oscillator means to stabilize the oscillating frequency thereof, an improvement comprising;

means for generating a series of harmonic waves from the reference signal from said reference frequency oscillator means, said series of harmonic waves being applied to said phase comparator means for phase comparing with the output from said voltage controlled oscillator means, means for coarsely changing the output frequency of said voltage controlled oscillator means to a desired frequency, first gate means coupled with the output of said voltage controlled oscillator means, counter means for counting the number of output waves from said voltage controlled oscillator means through said first gate means, first latching means coupled with an output of said counter means which provides the least significant digit of a decimal number of a count by said counter means, second gate means connected in a closed loop comprising said voltage controlled oscillator means and said phase comparator means, means for providing a gate signal to make said second gate means conductive at a time when the number from said first latching means is within a predetermined range, second latching means coupled with said counter means, first indicator means for indicating the desired frequency value correspondingly to the counted number through said second latching means, and means coupled with the output from said reference frequency oscillator means for providing a gate pulse to make said first gate means conductive, latching signals to operate said first and second latching means and a reset signal to reset said counter means, said gate pulse having a pulse width predetermined correspondingly to the reference frequency and being repeatedly generated with a constant period, said latching signals being provided just after each one of said gate pulses ends, and said reset signal being generated after said latching signals but before next gate pulse.

2. The improvement as claimed in claim 1, wherein said coarsely frequency changing means is provided with a second indicator means for indicating numbers of the higher orders of the desired frequency value selected thereby, said first indicator means indicating numbers of the lower orders of the desired frequency value correspondingly to the counted number through said second latching means.

3. The improvement as claimed in claim 2, wherein said pulse width of said gate pulse is determined equal to the period of said reference frequency, said predetermined range at a time when said gate signal providing means generates the gate signal being the numbers 9, 0 and 1.

4. The improvement as claimed in claim 3, wherein the reference frequency is determined $10^n$ Hz ($n$ is a positive integer), said counter means comprising a first counter means for decimal numbers of one digit and a second counter means for counting carry signals from said first counter means to provide said numbers of the lower orders, and said first indicator means indicating the counted numbers at said second counter means.

5. The improvement as claimed in claim 4, wherein said harmonic waves generating means is a monostable multivibrator circuit.

6. The improvement as claimed in claim 4, wherein said coarsely frequency changing means is a variable condenser of a type including movable electrode means, said second indicator means being controlled by the movement of said movable electrode means.

7. The improvement as claimed in claim 4, wherein said coarsely frequency changing means is a variable voltage DC source means, the output of said variable DC source means being applied to said voltage controlled oscillator to control the oscillating frequency thereof.

8. The improvement as claimed in claim 4, which further comprises digital analogue converter means for converting the number from said first latching means into a corresponding analogue signal, said analogue signal being zero voltage at a time when said number from said first latching means is within the range of 9, 0 and 1, and means for applying said analogue signal to said voltage controlled oscillator means as a voltage control signal.

9. The improvement as claimed in claim 8, wherein said analogue signal applying means is an adder circuit means which has two input terminals coupled with the outputs of said phase comparator means and said digital-analogue converter means, respectively, and an output terminal connected to said voltage controlled oscillator for frequency control thereof.

10. The improvement as claimed in claim 9, wherein said coarsely frequency changing means is a variable voltage DC source means, said adder circuit means having a further input terminal connected to the output of said variable voltage DC source means, and said second indicator means being controlled together with said variable voltage DC source means.

11. A frequency synthesizer device which comprises: a phase locked loop comprising voltage controlled oscillator means, reference frequency oscillator means, means for generating a series of harmonic waves from the reference frequency signal from said reference frequency oscillator means, mixer means for mixing both outputs of said voltage controlled oscillator means and said harmonic wave generating means, IF frequency generating means for generating IF frequency wave having a frequency of $a$ ($a$ is a positive integer) times of the reference frequency value, phase-comparator means for phase-comparing the output of said mixer means with the IF frequency wave to apply the compared output to said voltage controlled oscillator means to stabilize the oscillating frequency thereof, means for coarsely changing the output frequency of said voltage controlled oscillator means to a desired frequency, first gate means coupled with the output of said voltage controlled oscillator means, counter means for counting the number of output waves from said voltage controlled oscillator means through said first gate means, first latching means coupled with an output of said counter means which provides the least significant digit of a decimal number of a count by said counter means, second gate means being connected in a closed loop comprising said voltage controlled oscillator means, said mixer means and said phase comparator means, means for providing a gate signal to make said second gate means conductive at a time when the number from said first latching means is within a predetermined range, second latching means coupled with said counter means, first indicator means for indicating the desired frequency value correspondingly to the counted number through said second latching means, and means coupled with the output from said reference frequency oscillator means for providing a gate pulse to make said first gate means conductive, latching signals to operate said first and second latching means and a reset signal to reset said counter means, said gate pulse having a pulse width predetermined correspondingly to the reference frequency and being repeatedly generated with a constant period, said latching signals being provided just after each one of said gate pulses ends, and said reset signal being generated after said latching signals but before next gate pulse.

12. The synthesizer as claimed in claim 11, wherein said coarsely frequency changing means is provided with a second indicator means for indicating numbers of the higher orders of the desired frequency value selected thereby, said first indicator means indicating numbers of the lower orders of the desired frequency value correspondingly to the counted number through said second latching means.

13. The synthesizer as claimed in claim 12, wherein said pulse width of said gate pulse is determined equal to the period of said reference frequency, said predetermined range at a time when said gate signal providing means generates the gate signal being the number 9, 0 and 1.

14. The synthesizer as claimed in claim 13, wherein the reference frequency is determined $10^n$ Hz ($n$ is a positive integer), said counter means comprising a first counter means for decimal numbers of one digit and a second counter means for counting carry signals from said first counter means to provide said numbers of the lower orders, and said first indicator means indicating the counted numbers at said second counter means.

15. The synthesizer as claimed in claim 14, wherein said harmonic waves generating means is a monostable multivibrator circuit.

16. The synthesizer as claimed in claim 14, wherein said coarsely frequency changing means is a variable condenser of a type including movable electrode means, said second indicator means being controlled by the movement of said movable electrode means.

17. The synthesizer as claimed in claim 14, wherein said coarsely frequency changing means is a variable voltage DC source means, the output of said variable DC source means being applied to said voltage controlled oscillator to control the oscillating frequency thereof.

18. The synthesizer as claimed in claim 14, which further comprises digital analogue converter means for converting the number from said first latching means into a corresponding analogue signal, said analogue signal being zero voltage at a time when said number from said first latching means is within the range of 9, 0 and 1, and means for applying said analogue signal to said voltage controlled oscillator means as a voltage control signal.

19. The synthesizer as claimed in claim 18, wherein said analogue signal applying means is an adder circuit means which has two input terminals coupled with the outputs of said phase comparator means and said digital-analogue converter means, respectively, and an output terminal connected to said voltage controlled oscillator for frequency control thereof.

20. The synthesizer as claimed in claim 19, wherein said coarsely frequency changing means is a variable voltage DC source means, said adder circuit means having a further input terminal connected to the output of said variable voltage DC source means, and said second indicator means being controlled together with said variable voltage DC source means.

* * * * *